United States Patent [19]

Khan et al.

[11] Patent Number: 5,227,328
[45] Date of Patent: Jul. 13, 1993

[54] METHOD OF PRODUCING EPITAXIAL LAYERS OF II-VI SEMICONDUCTORS WITH HIGH ACCEPTOR CONCENTRATIONS

[75] Inventors: Babar A. Khan; Nikhil R. Taskar, both of Ossining, N.Y.

[73] Assignee: North American Philips Corporation, New York, N.Y.

[21] Appl. No.: 851,452

[22] Filed: Mar. 16, 1992

Related U.S. Application Data

[62] Division of Ser. No. 680,179, Apr. 3, 1991, abandoned.

[51] Int. Cl.$^5$ .............................................. H01L 21/324
[52] U.S. Cl. ......................................... 437/82; 437/247; 437/936; 148/DIG. 64
[58] Field of Search .................. 437/23, 81, 82, 103, 437/104, 127, 129, 247, 905, 936; 148/DIG. 3, DIG. 63, DIG. 64, DIG. 95, DIG. 99

[56] References Cited

U.S. PATENT DOCUMENTS

| | | | |
|---|---|---|---|
| 4,151,008 | 4/1979 | Kirkpatrick | 437/936 |
| 4,558,509 | 12/1985 | Tiwari | 437/247 |
| 5,068,204 | 11/1991 | Kukimoto et al. | 437/127 |

OTHER PUBLICATIONS

B. J. Skromme et al., Rapid Thermal Annealing and Ion Implation of Heteroepitaxial ZnSe/GaAs, Bellcore, MRS Proceedings, 1989, pp. 1-7, FIGS. 1-6.

*Primary Examiner*—Brian E. Hearn
*Assistant Examiner*—C. Chaudhari
*Attorney, Agent, or Firm*—Norman N. Spain

[57] ABSTRACT

Epitaxial layers of II-VI semiconductors in-situ doped with high concentrations of a stable acceptor-type impurity and capped with a diffusion-limiting layer, when subjected to a rapid thermal anneal at a temperature between 700 and 950 degrees C., exhibit a high conversion of the impurities to acceptors, sufficient to render the layers p-type.

10 Claims, 3 Drawing Sheets

METHOD OF PRODUCING EPITAXIAL LAYERS OF II-VI SEMICONDUCTORS WITH HIGH ACCEPTOR CONCENTRATIONS

This is a division of application Ser. No. 07/680,179 now abandoned filed Apr. 3, 1991.

BACKGROUND OF THE INVENTION

This invention relates to II-VI semiconductor compounds, and more particularly relates to epitaxial layers of such compounds having high concentrations of acceptor-type impurities, and also relates to a process for producing such layers.

As is known, semiconductors are characterized as either n-type or p-type, depending upon whether the predominant carriers in the material are electrons or holes. As is also known, semiconductors can be rendered n-type or p-type by substituting impurity atoms (dopants) for atoms of the host lattice which have a different valence. Donor-type impurities are those which give electrons, and thus render the host material n-type, while acceptor-type impurities are those which receive electrons, and thus render the host p-type.

Successful doping to obtain or enhance n-type or p-type conductivity depends not only upon the ability to introduce a sufficient amount of the proper dopant into the semiconductor material, but also upon the ability to position the dopant atoms in the proper substitutional sites within the material's crystal lattice where they can give or receive electrons.

Dopants which do not readily assume the proper substitutional sites in sufficient number can be activated, i.e., converted to donors or acceptors, e.g., by a thermal anneal of the doped semiconductor material.

Another important consideration is the presence of other impurities in the semiconductor material which are, or are capable of assuming, an opposite conductivity type than that intended, thus compensating the effect of the dopant. Thus, it is actually the net donor or acceptor concentration which determines the overall conductivity of the material.

Semiconductors which can easily be rendered either n-or p-type, such as Si, from Group IVA of the Periodic Table, and GaAs, a III-V compound, so-called because it is made up of elements from Groups IIIA and VA of the Periodic Table, can be converted to devices such as diodes by doping adjacent regions p-and n-type to form pn junctions.

II-VI compounds such as ZnS and ZnSe are of interest for such devices because of their relatively wide band gaps. For example, being able to form a doped junction in an epitaxial layer of ZnSe could result in a blue-emitting LED or laser.

However, in practice, it has proved extremely difficult to obtain stable p-type ZnSe epitaxial layers. While a sufficient amount of dopant can usually be introduced into the layers, it is either difficult to convert sufficient numbers of the dopant atoms into acceptors, or the acceptors are unstable. For example, lithium-doped epitaxial layers of ZnSe can be converted to p-type material (defined herein as a material having a net acceptor concentration greater than $1 \times 10^{14}$ acceptors or holes per cc)., but lithium is unstable because of its tendency to diffuse, even at relatively low temperatures.

Nitrogen would be a more stable acceptor than lithium, and can be doped into ZnSe in situ in high concentrations ($10^{19}$/cc) using metal organic chemical vapor deposition (MOCVD). However, only a small fraction of it (up to $1 \times 10^{14}$/cc) can be activated.

Greater success has been achieved using chemical beam epitaxy (CBE). That is, starting with an as-grown dopant concentration of about $10^{19}$, a net acceptor concentration in the range of $10^{16}$ to $10^{17}$ has been achieved. However, the technique requires relatively expensive equipment and the conversion efficiency is relatively low.

Dopants are usually activated by a carefully controlled thermal treatment such as a furnace anneal, which allows the dopant ions to relax into the correct substitutional sites in the host lattice.

Rapid thermal annealing (RTA) has been employed as an alternative to furnace annealing to activate shallow acceptor implants of N in ZnSe heteroepitaxial layers on GaAs, in order to minimize degradation of the material by interdiffusion. In addition, a diffusion-limiting capping layer of $SiO_2$ or $Si_3N_4$ has been employed as further protection from degradation. Samples annealed at 600 degrees C. and above did not exhibit p-type behavior. Also, no evidence of N acceptors was observed in the PL spectra. Samples annealed at 500 degrees C. showed evidence of N acceptor in the PL spectra, but were not p-type. "Rapid Thermal Annealing and Ion Implantation of Heteroepitaxial ZnSe/GaAs", B. J. Skromme et al., Bellcore, MRS Proceedings, 1989.

OBJECTS AND SUMMARY OF THE INVENTION

It is an object of the invention to provide stable p-type epitaxial layers of II-VI semiconductor compounds.

It is a further object of the invention to provide a method for producing such layers.

It is another object of the invention to provide a method for increasing the net acceptor concentration of epitaxial layers of II-VI semiconductor compounds.

In accordance with one aspect of the invention, a stable p-type chemical vapor deposited epitaxial layer of a II-VI semiconductor compound is provided.

In accordance with another aspect of the invention, such a layer is obtained by in-situ doping the layer with a stable acceptor-type impurity, capping the layer with a diffusion-limiting layer, and subjecting the resultant structure to a rapid thermal anneal (RTA) at a temperature within the range of about 700 to 950 degrees C.

In accordance with yet another aspect of the invention, the net acceptor concentration in an epitaxial layer of a II-VI semiconductor compound containing a stable acceptor-type impurity is increased by capping the layer with a diffusion-limiting layer, and subjecting the resultant structure to a rapid thermal anneal (RTA) at a temperature within the above mentioned range.

In accordance with a preferred embodiment of the invention, the epitaxial layer is ZnSe, the impurity dopant is N, and the capping layer is selected from the group consisting of $SiO_2$ and $Si_3N_4$.

The rapid thermal anneal should be carried out for a time sufficient to result in substantial conversion of the impurity dopant to acceptors, but insufficient to result in substantial degradation of the epitaxial layer, due for example to inter-diffusion across the boundary surfaces of the layer, and/or out-diffusion from the capping layer.

It will be appreciated that based on the above considerations, the maximum allowable time at any one temperature within the above range will be shorter at higher temperatures. Thus, the time should not exceed 10 seconds at 950 degrees C., but may be as long as 2 minutes at 700 degrees C.

DESCRIPTION OF THE PREFERRED EMBODIMENTS

Figure 1:
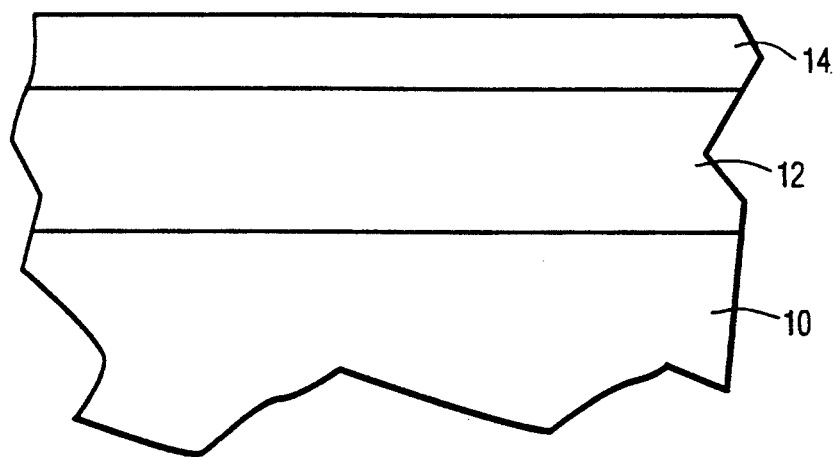
FIG. 1 is a cross-section of one embodiment of a structure of the invention including as epitaxial layer of a II–VI semiconductor compound on a substrate, and a diffusion-limiting layer on the epitaxial layer.

Referring to FIG. 1, there is shown an epitaxial layer 12 of a II–VI semiconductor compound such as ZnS, ZnSe, or Zn(S,Se), which has been grown on a suitable substrate 10 such as GaAs. Deposited on top of the epitaxial layer 12 is a cap 14 of a diffusion-limiting layer of a material such as $SiO_2$ or $Si_3N_4$.

Incorporated into the epi layer 12 is a concentration of a stable acceptor-type impurity such as N. This impurity is introduced by in-situ doping, i.e., introduced during growth of the epi layer, e.g., by growing the layer in the presence of ammonia. This method of doping enables then introduction of sufficient concentration of dopant at suitable sites within the lattice of host crystal, so that upon subjecting these sites to a rapid thermal anneal, a substantial number of the dopant ions at these sites relax into the correct substitutional sites for activation. Growth of the epitaxial layer is preferably by chemical vapor deposition (CVD), but other methods, such as chemical beam epitaxy (CBE) are also possible.

The capping layer 14 is essential to prevent out-diffusion of Zn and S or Se from the epitaxial layer, and also to suppress the diffusion of Ga or other mobile species from the substrate into the epitaxial layer during RTA. As is known, Ga is a donor-type impurity in II–VI compounds, so that its presence in the epitaxial layer would result in undesirable compensation of the acceptors.

Figure 3:
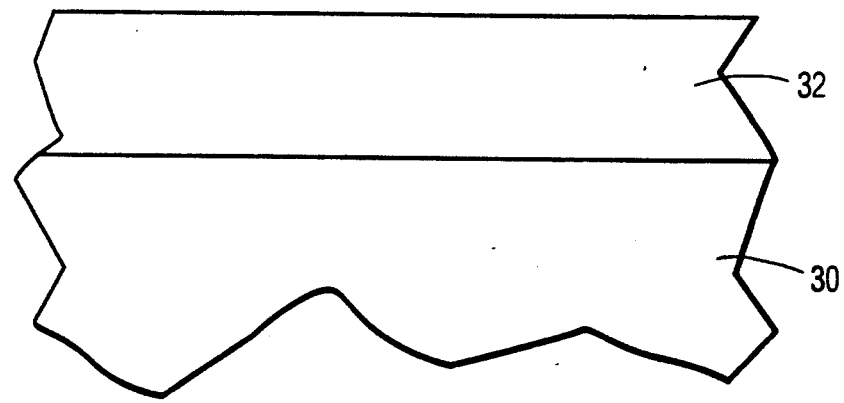
FIG. 3 is a cross-section similar to that of FIG. 1, in which the diffusion-limiting layer has been removed following a rapid thermal anneal of the structure.

After completion of the RTA, the capping layer 14 may be removed, as shown in FIG. 3, provided it serves no other purpose.

Figure 2:
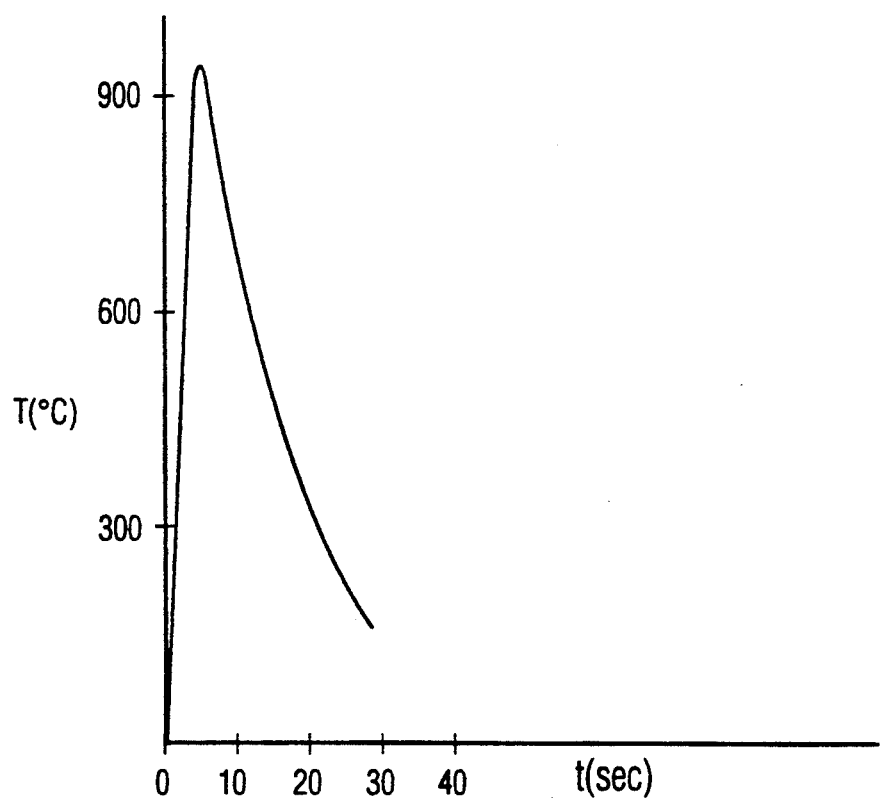
FIG. 2 is a time-temperature graph of a typical rapid thermal anneal (RTA) of the invention.

FIG. 2 shows a typical time/temperature relationship (triangular profile) for an RTA carried out using a lamp annealing system. As seen from the graph, a peak temperature of 950 degrees C. is reached in about 5 seconds, after which the lamp is turned off, causing the temperature to decline to below 200 degrees C. in less than 25 seconds. Alternative methods of carrying out an RTA include pulsed graphite heater annealing and pulsed laser annealing.

Figure 4:
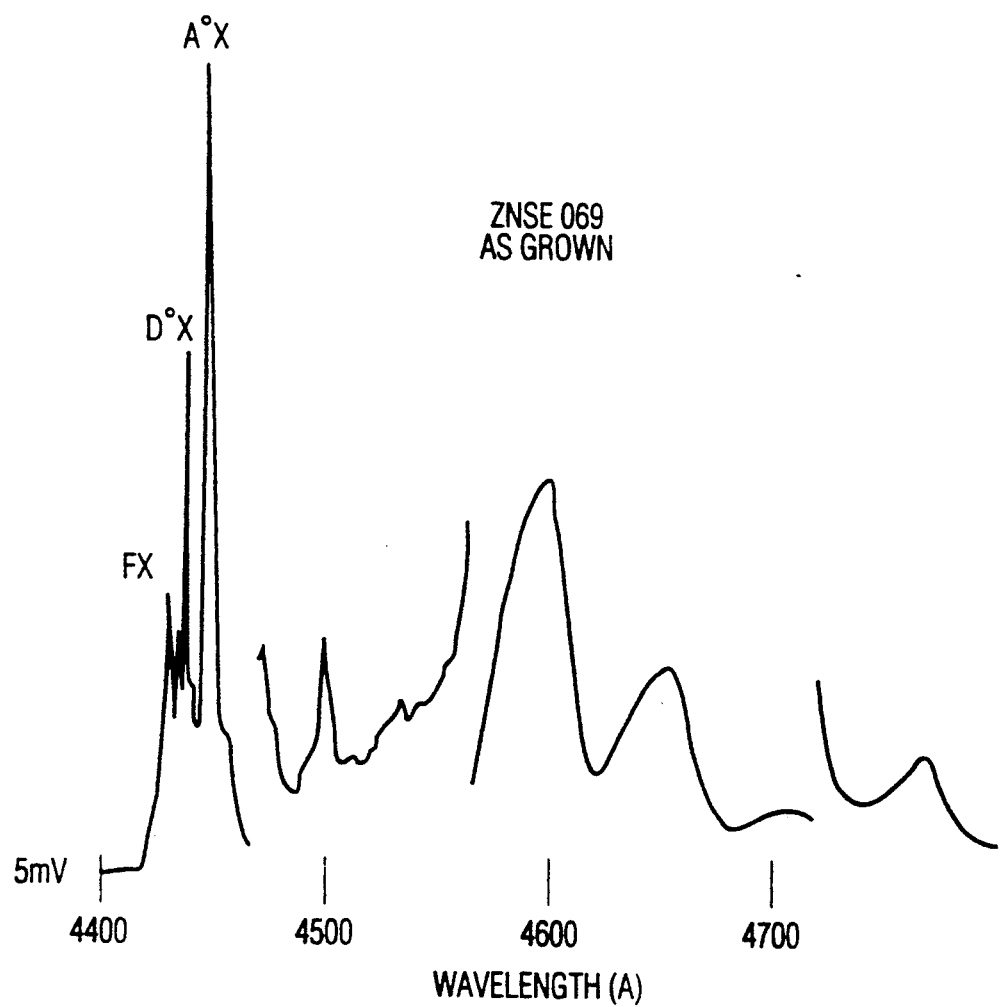
FIG. 4 is a plot of a photoluminescence (PL) spectrum for an epitaxial layer of the invention prior to RTA.
Figure 5:
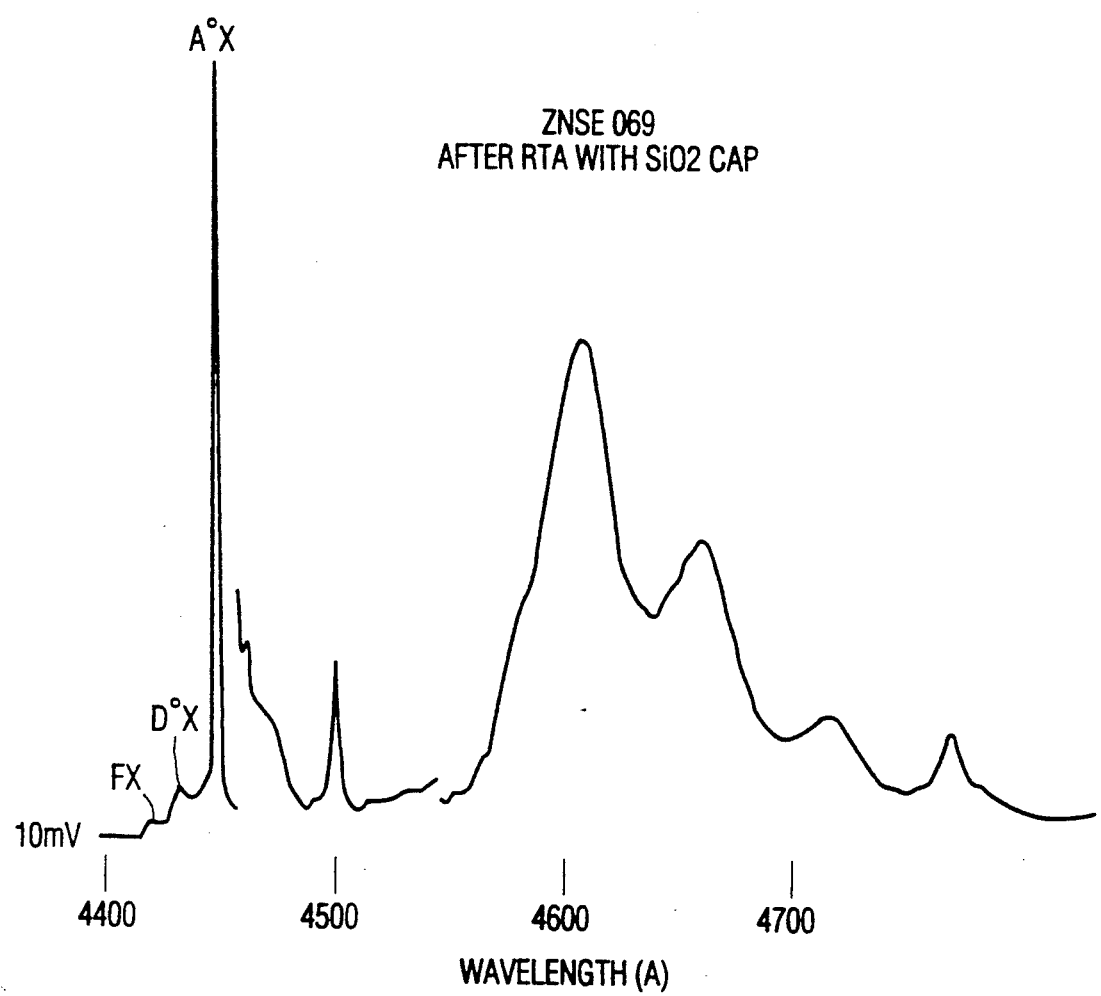
FIG. 5 is a plot similar to that of FIG. 4 obtained for the same layer after RTA.

By way of example, epitaxial layers of ZnSe were grown on GaAs substrates using MOCVD and doped with N in situ using ammonia. Subsequently, an $SiO_2$ capping layer was sputtered onto the epitaxial layer, and the resultant structure subjected to a lamp anneal having the profile shown in FIG. 2. The epitaxial layers were characterized by photoluminescense (PL) before and after RTA. Results are shown in FIGS. 4 and 5, in which PL intensity in arbitrary units is plotted versus excitation wavelength in Angstroms. As may be seen in FIG. 4, before RTA the relative intensity of acceptor bound excitons ($A°x$) and donor bound excitons ($D°x$) to free excitons ($Fx$) is about 5 and 3, respectively. The relatively large presence of shallow donors is characteristic of $NH_3$-doped layers. FIG. 5 shows that after RTA, the $A°x$ to $Fx$ ratio has increased to about 25, while the $D°x$ to $Fx$ ratio has remains unchanged, indicating that the net acceptor concentration has been increased as a result of the RTA.

Capacitance versus voltage (C-V) measurements were also carried out before and after RTA, using the technique described by T. Marshall et al. in "DC and AC Transport in Molecular Beam Epitaxy Grown Metal/ZnSe/GaAs Heterojunction Structures", J. Appl. Phys., 66 (4), Aug. 15, 1989; and "Electrical Characterization of p-type ZnSe:Li Epilayers Grown on p+ GaAS by Molecular Beam Epitaxy", Apr. 1, 1991 JAP. Before RTA, the samples were fully depleted, indicating a net acceptor concentration too low to measure. After RTA, the net acceptor concentration had increased to about $1 \times 10^{**}16$ per cc.

Additional samples of epitaxial ZnSe layers, grown on GaAs substrates, doped with N and capped with $SiO_2$ layers were prepared, either by MOCVD or flow modulation epitaxy (herein FME), a variation of MOCVD in which growth of the epitaxial layer is periodically interrupted to introduce a layer of dopant.

The samples were divided into sets and subjected to rapid thermal annealing at various temperatures using lamp annealing to achieve a triangular temperature profile like that shown in FIG. 2. The so-treated samples were then measured for net acceptor concentration, using the C-V technique. Results are shown in the following Table.

TABLE

| | RTA Peak Temp °C./Net Acceptor Conc. (per cc) | | | | | |
|---|---|---|---|---|---|---|
| Set No. | 725 | 780 | 825 | 850 | 900 | 950 |
| 1 | $3 \times 10^{15}$ | — | — | — | — | — |
| 2* | — | $1.5 \times 10^{16}$ | $1.4 \times 10^{16}$ | $1.6 \times 10^{16}$ | — | $1 \times 10^{16}$ |
| 3 | $1 \times 10^{15}$ | $1.5 \times 10^{16}$ | $2 \times 10^{16}$ | — | $2 \times 10^{16}$ | $5 \times 10^{15}$ |
| 4* | $1 \times 10^{15}$ | $1.8 \times 10^{16}$ | — | — | — | — |
| 5 | — | — | — | — | — | $1 \times 10^{16}$ |

*indicates prepared by FME.

As may be seen from the Table, p-type material was obtained for all samples subjected to a peak temperature in the range of 725 to 950 degrees C.

To demonstrate the effects of other temperature profiles, samples from set 3 were subjected to RTAs in which the lamp power was controlled to achieve and hold a peak temperature of 700 degrees C. for 10 and 30 seconds, respectively. Net acceptor concentrations of $1\times 10^{}15$ and $8\times 10^{}15/cc$, respectively, were obtained.

An RTA at a peak temperature of 600 degrees C. for 10 seconds gave no measurable value of net acceptor concentration for any sample.

While there have been shown and described what are at present considered to be the preferred embodiments of the invention, it will be apparent to those skilled in the art that various changes and modifications may be made therein without departing from the scope of the invention as defined by the appended claims.

We claim:

1. A method for obtaining a stable p-type epitaxial layer of a II–VI semiconductor compound, the method comprising forming an epitaxial layer of the compound by chemical vapor deposition, in-situ doping the layer with a stable acceptor-type impurity, capping the epitaxial layer with a diffusion-limiting layer, and subjecting the resultant structure to a rapid thermal anneal at a temperature in the range of about 700° to 950° C. for a period of from 10 seconds at 950 degrees C. to 2 minutes at 700° C.

2. A method for increasing the net acceptor concentration of an epitaxial layer of a II–VI semiconductor compound containing acceptor-type impurities, the method comprising capping the layer with a diffusion-limiting layer, and subjecting the resultant structure to a rapid thermal anneal at a temperature in the range of about 700° to 950° C. for a period of from 10 seconds at 950° to 2 minutes at 700° C.

3. The method of claim 1 or 2 in which the compound is ZnSe.

4. The method of claim 1 or 2 in which the acceptor-type impurity is N.

5. The method of claim 1 or 2 in which the diffusion-limiting layer is selected from the group consisting of $Si_3N_4$ and $SiO_2$.

6. The method of claim 2 in which the epitaxial layer is produced by chemical vapor deposition and the stable acceptor-type impurity is doped in situ.

7. The method of claim 1 in which the epitaxial layer is doped with the stable acceptor-type impurity at a concentration of greater than $1\times 10^{14}$ per cubic centimeter.

8. A method of obtaining a stable p-type epitaxial layer of ZnSe, said method comprising forming an epitaxial layer of ZnSe by chemical vapor deposition, in-situ doping said layer with a stable acceptor-type impurity at a concentration of greater than $1\times 10^{14}$ per cubic centimeter, capping said doping layer with a diffusion-limiting layer and subjecting the resultant structure to a rapid thermal anneal at a temperature of 700 to 950 degrees C. for a period of from 10 seconds at a temperature of 950 degrees C. to 2 minutes at a temperature of 700 degrees C.

9. The method of claim 8 wherein the acceptor-type impurity is N.

10. The method of claim 9 wherein the diffusion-limiting layer is formed of a material selected from the group consisting of $Si_3N_4$ and $SiO_2$.

* * * * *